United States Patent
Chiu

(10) Patent No.: US 8,264,906 B2
(45) Date of Patent: Sep. 11, 2012

(54) ADJUSTING CLOCK ERROR ACROSS A CIRCUIT INTERFACE

(75) Inventor: Glenn Chiu, San Bruno, CA (US)

(73) Assignee: Rambus Inc., Sunnyvale, CA (US)

( * ) Notice: Subject to any disclaimer, the term of this patent is extended or adjusted under 35 U.S.C. 154(b) by 438 days.

(21) Appl. No.: 12/597,726

(22) PCT Filed: May 2, 2008

(86) PCT No.: PCT/US2008/005858
§ 371 (c)(1),
(2), (4) Date: Oct. 26, 2009

(87) PCT Pub. No.: WO2008/153645
PCT Pub. Date: Dec. 18, 2008

(65) Prior Publication Data
US 2010/0135100 A1 Jun. 3, 2010

Related U.S. Application Data

(60) Provisional application No. 60/932,452, filed on May 29, 2007.

(51) Int. Cl.
*G11C 8/00* (2006.01)
*G11C 7/00* (2006.01)
(52) U.S. Cl. .......... 365/233.11; 365/191; 365/194; 365/233.1; 365/233.12
(58) Field of Classification Search .......... 365/191, 365/194, 233.1, 233.11, 233.12
See application file for complete search history.

(56) References Cited

U.S. PATENT DOCUMENTS

| | | | |
|---|---|---|---|
| 5,764,110 A | 6/1998 | Ishibashi | 331/57 |
| 6,201,754 B1 | 3/2001 | Ooishi et al. | 365/266 |
| 6,424,198 B1 * | 7/2002 | Wolford | 327/291 |
| 7,132,903 B1 | 11/2006 | Johnson et al. | 331/185 |

(Continued)

FOREIGN PATENT DOCUMENTS

JP 2000035831 A2 2/2000

OTHER PUBLICATIONS

International Preliminary Report on Patentability with mail date Sep. 15, 2009 Regarding PCT/US2008/005858 filed on May 2, 2008. 16 pages.

(Continued)

*Primary Examiner* — Ly D Pham

(57) ABSTRACT

A system is provided with clock skew measurement and correction technology. A first circuit or memory controller 4 includes measuring circuits to measure relative timing or phase offsets of multiple clock signals of a second circuit or memory 6. One measuring circuit is configured for incremental changing of the phase of a transmitted test data sequence to measure and correct timing of a memory receiver circuit's quadrature clocks based on results of a data comparison of transmitted and received test data. Another measuring circuit is configured to scan a received test data sequence for data transitions to measure and correct timing of a memory transmitter circuit's quadrature clocks based on spacing or timing between detected transitions. Individual memory clock generators 30 are controlled with adjustable delay circuits 47 for changing phase of different clock signals of the memory to set the clock signals based on the measurements of the controller.

26 Claims, 12 Drawing Sheets

U.S. PATENT DOCUMENTS

| | | | |
|---|---|---|---|
| 2003/0117864 A1 | 6/2003 | Hampel et al. | 365/200 |
| 2005/0168255 A1 | 8/2005 | Gauthier et al. | 327/161 |
| 2006/0104151 A1* | 5/2006 | Stark | 365/233 |
| 2007/0086268 A1* | 4/2007 | Shaetfer et al. | 365/233 |
| 2009/0238025 A1* | 9/2009 | Shaeffer et al. | 365/233.1 |
| 2009/0274218 A1* | 11/2009 | Lavelle et al. | 375/240.25 |

OTHER PUBLICATIONS

EP Office communication pursuant to Article 94(3) EPC dated Sep. 22, 2010, re EP Application No. 08767634.2. 6 pages.

EP Response dated Mar. 31, 2011 to the Official Communication dated Sep. 22, 2010 for EP Application No. 08767634.2. 37 Pages.

* cited by examiner

ADJUSTING CLOCK ERROR ACROSS A CIRCUIT INTERFACE

CROSS-REFERENCE RELATED TO APPLICATION

The present application claims the benefit of Provisional Application Ser. No. 60/932,452, filed May 29, 2007, entitled ADJUSTING CLOCK ERROR ACROSS A CIRCUIT INTERFACE, the disclosure of which is hereby incorporated herein by reference.

BACKGROUND OF THE EMBODIMENT

Digital systems utilize timing signals to synchronize activity between circuit blocks. For example, as data signals pass from one circuit element to another or between circuits of a synchronous digital system, a clock signal is implemented to coordinate the actions of two or more elements of the circuits so that data signals may be accurately processed. A clock signal is typically a signal that oscillates between high and low voltage levels. Logic circuit elements respond to one or more features of the oscillating clock signal, such as a rising edge and/or a falling edge or some other function thereof. Clocking schemes can be based on other variations and other characteristics of a signal depending on the type of signal and the medium through which the signal traverses.

Systems may generate multiple clock signals based on a common system clock signal or a reference clock signal. For example, in one type of quadrature clocking system, timing circuits generate four clock signals that are ninety degrees out-of-phase with each other. Such quadrature clock signals can permit components of a system to increase performance relative to a reference clock signal. These signals can be distributed along multiple paths that permit a system to utilize parallel circuit components for distributing operations. The signal paths of each distributed clock signal throughout a circuit can be referred to as a clock tree.

Generally, as each clock signal advances along its branch of the clock tree, the signal may experience propagation delay. Propagation delays are affected by variables such as distance, temperature, supply voltage and process parameters. For example, at a low operating temperature with a high supply voltage, signals may be transmitted with a relatively short delay. It is not uncommon for different propagation delays to exist on different clock signal paths. This situation can cause the clock signals of the different clock paths to skew or shift out of phase with respect to their expected relationships with one another. This situation can cause a reduction in timing margins associated with data recognition windows for data signals. Thus, it would be beneficial to have a system that can maintain clock signal phase synchronization in the presence of different signal path propagation delays.

BRIEF DESCRIPTION OF THE DRAWINGS

The present technology is illustrated by way of example, and not by way of limitation, in the figures of the accompanying drawings, in which like reference numerals refer to similar elements including.

DETAILED DESCRIPTION

Figure 1:
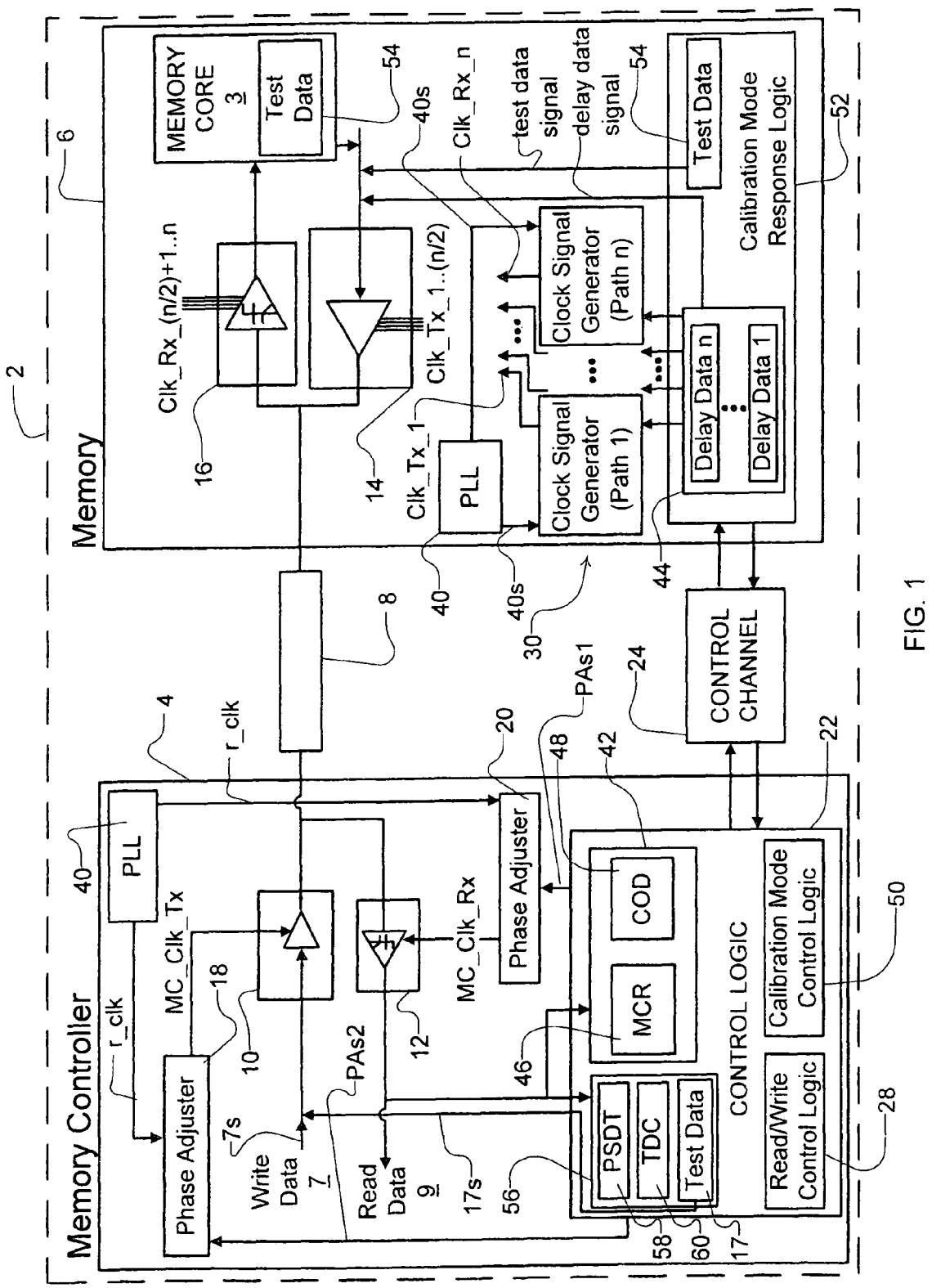
FIG. 1 is block diagram showing an example embodiment of the present clock skew correction technology.

A data system 2 according to one embodiment (FIG. 1) of the clock skew correction technology disclosed herein includes a first circuit which in this embodiment is a memory controller 4. The system further includes a second circuit which in this embodiment is a memory 6 such as, for example, a random access memory or dynamic random access memory. A set of one or more channels 8 extend between memory controller 4 and memory 6 for transmission of signals between the circuits.

In the particular embodiment depicted, the first circuit block or memory controller 4 is formed as one integrated circuit chip and the second circuit block or memory 6 includes one or more integrated circuit chips separate from chip of the memory controller 4. Data system 2 also includes a data channel 8. The data channel 8 may include elements commonly used for transmission of signals between chips such as, for example, wires or conductors on a circuit panel. Merely by way of example, the memory controller and memory may be parts of a single computer system or other electronic device, and may be disposed in proximity to one another as, for example, within about 10 meters of one another, and the data channels may be less than about 10 meters long.

Memory controller 4 includes input/output (I/O) circuits such as the transmitter 10 circuit block or sending means, which is arranged to receive write data 7 (which will eventually be written into the memory 6) and to send output signals to the channel 8 that may be performed using one or more optional drivers. The transmitter produce an output signal at certain time intervals regulated by a memory controller transmit clock signal (MC_Clk_Tx) which is received by the transmitter 10. The output signal may contain particular write data from a write data signal 7s or test data 17 in a test data signal 17s generated by the memory controller 4. The test data 17 may be stored in one or more registers or data elements of the memory controller. A multiplexer circuit (not shown) controlled by the control logic of the memory controller may selectively route either the write data signal 7s or the test data signal 17s to the input of the transmitter 10. The output signal sent during a particular data interval from the transmitter will typically have a signal parameter, such as current or voltage, which represents a 1 or 0 value for a single bit of the write data. Although, other data representation or symbol schemes may be utilized.

In the particular embodiment of FIG. 1, the output signal from transmitter 10 circuit block of the memory controller typically is sent as unmodulated or baseband signals along the channel 8. Stated another way, in this embodiment the output signals are not modulated on a carrier wave. Transmitter circuit block may also optionally include a transmit equalization circuit (not shown) for improving a representation of the data signals on the channel to compensate for signal transmission issues such as intersymbol interference (ISI) or inter-channel interference (ICI).

The first circuit or memory controller 4 also includes a receiver 12 circuit block as part of its input/output (I/O) circuits. The receiver circuit block or receiver means is arranged to sample a signal representing data sent to the memory controller along one or more of the channels 8, and to convert each such sample into one or more values of read data 9. In the particular example depicted, the receiver circuit block is arranged to sample a signal parameter of a signal received from the memory during each data interval of the received signal, and to compare a value of the signal parameter to a threshold so as to assign a digital data value, such as a 1 or 0 bit, to the signal for each data interval. Timing of the sampling operation by the receiver 12 circuit is regulated by the memory controller receive clock signal (MC_Clk_Rx) which is received by the receiver 12. Optionally, the receiver 12 circuit block may also include a receiver equalization circuit (not shown) to modify the signal parameter of the received signal or make an adjustment to the receiver, such as changing a voltage reference or the phase of a timing reference, to improve the representation of data in the received signal to compensate for transmission distortion of the channel such as ISI or ICI.

The memory controller 4 of FIG. 1 also includes one or more clock phase adjuster circuits 18, 20 or clock adjustment means, for producing an output clocking signal by controlled adjustment of a phase or frequency of an input clock signal (r_clk). The clock adjuster circuits also receive one or more control signals from control circuit block 22 of the memory controller 4. For example, one or more phase adjustment control signals PAs1 and PAs2 from the control circuit block 22 can control a phase adjustment of the clock signal output from the respective clock phase adjuster circuits 18, 22. In FIG. 1, clock phase adjuster circuit 18 outputs the memory controller transmit clock signal (MC_Clk_Tx) for transmitter 10 circuit to regulate the timing of its operation. Another clock phase adjuster circuit 20 outputs the memory controller receive clock signal (MC_Clk_Rx) of the receiver 12 circuit to regulate the timing of its operation. Thus, these clock phase adjuster circuits 18, 20 participate in regulating either the timing of reception or transmission of data signals with the input/output devices (e.g., receiver 12 and transmitter 10) of the memory controller.

As discussed in more detail herein, based on certain control logic, each clock phase adjuster circuit 18, 20 can make incremental phase adjustments, such as by reducing or increasing a delay, to its controlled output signal (e.g., the transmit clock signal MC_Clk_Tx or the receive clock signal MC_Clk_Rx) based on stored calibration information and/or measured conditions such as, for example, a phase offset between data intervals of a received data signal and receive clock signal MC_Clk_ Rx. One suitable clock phase adjuster circuit is the phase adjuster apparatus disclosed in U.S. Patent Application Publication No. 2003/0117864.

Figure 3A:
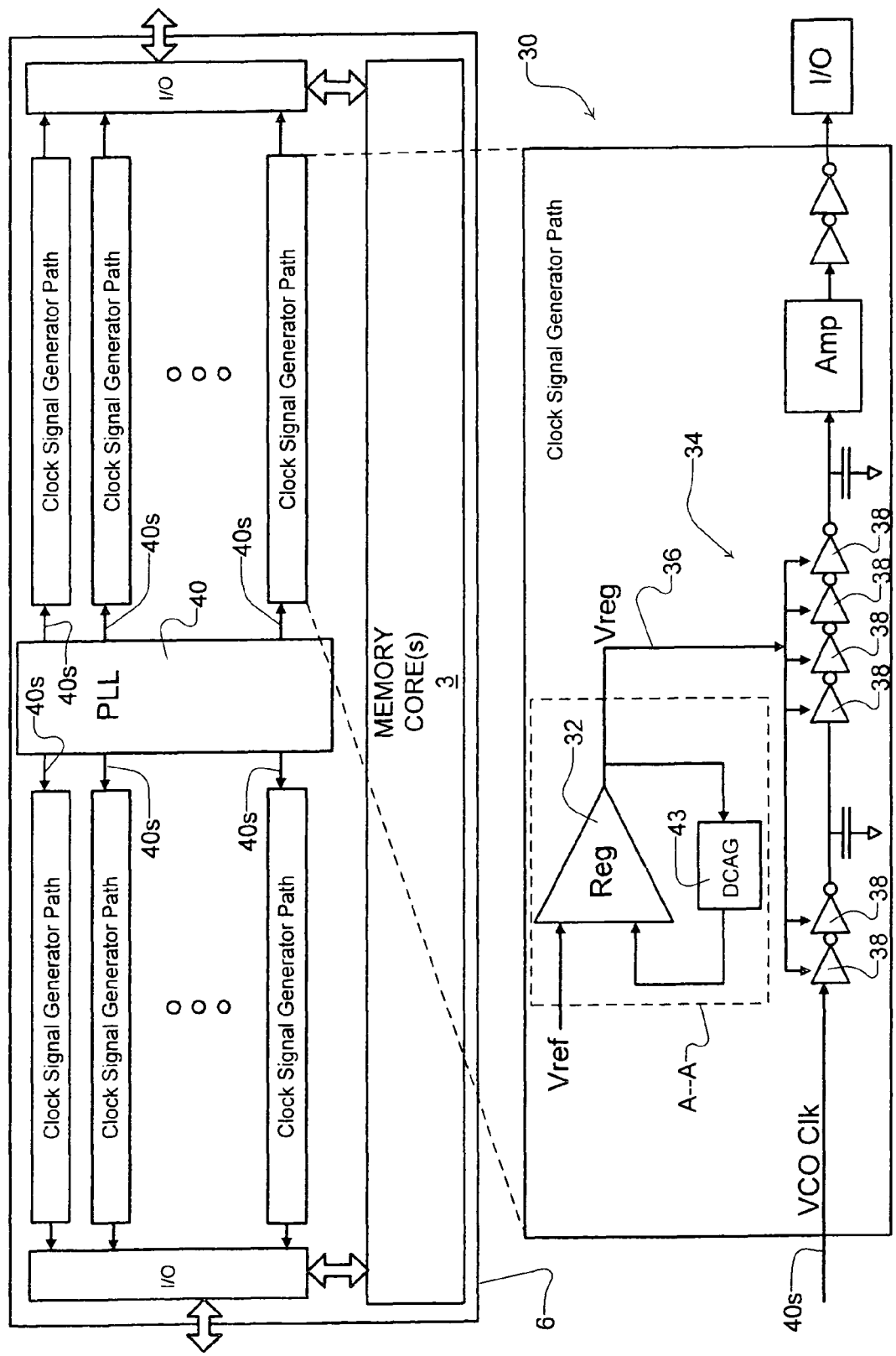
FIG. 3A is a block diagram of an example clock generation circuit with a controllable delay element for correcting skew along multiple paths of a clock tree of a memory.

In an alternative embodiment, the one or more clock phase adjuster circuit blocks 18, 20 may be implemented as a phase mixer circuit having inputs for a set of clock input signals such that the mixer will produce the clock signals of the transmitter circuit or receiver circuit of the memory controller and serve as a clock phase adjuster circuit. Moreover, in another embodiment, the clock phase adjuster circuits may be formed by a delay line or combination of delay lines. Such a delay line may be based on a plurality of inverters. An example of an inverter-based delay line is illustrated in FIG. 3A and discussed in more detail herein.

The clock phase adjuster circuits are typically formed with an input to accept an output of a timing circuit block 40 as illustrated in FIG. 1. Such a timing circuit 40 outputs a clock signal as a function of an input reference clock signal or system clock signal (not shown). Merely by way of example, timing circuit 40 may include conventional components such as frequency dividers or multipliers, phase-locked or delay-locked loops, and conventional control components for adjusting the operation of these elements.

Like the memory controller 4, the memory 6 will also include input/output devices for transmission and reception of signals with the channel 8. Thus, a transmitter circuit 14 serves as means for sending data signals from the memory on the channel 8. The receiver circuit 16 serves as a means for receiving data signals at the memory 6 from the memory controller 4. Like the memory controller, the memory 6 may optionally have equalization circuits. However, unlike the input/output devices of the memory controller, in the example of FIG. 1 the input/output devices of the memory operate on multiple clock signals. Thus, the data interval over which a data bit is driven to the channel is regulated by multiple transmit clock signals Clk_Tx_1. (n/2). Similarly, the times at which data bit can be sampled is regulated by multiple receive clock signals Clk_Rx_ (n/2)+1 . . . n. By interleaving multiple lower rate clock signals for the transmission or reception, the rate of performance of the input/output devices may be improved when compared to using a single clock signal of the same rate for each receiver or transmitter. Moreover, multiple lower rate clock signals may have power advantages when compared to using one clock signal at a comparable higher rate. For example, the memory 6 may be clocked as a quadrature component such that there are four clock signals for each transmitter and each receiver. Implementation of four clock signals for each is illustrated in the quadrature example of FIG. 2 (i.e., tx_clki, tx_clkq, tx_clki_bar, tx_clkq_bar and rx_clki, rx_clkq, rx_clki_bar, rx_clkq_bar).

Figure 2:
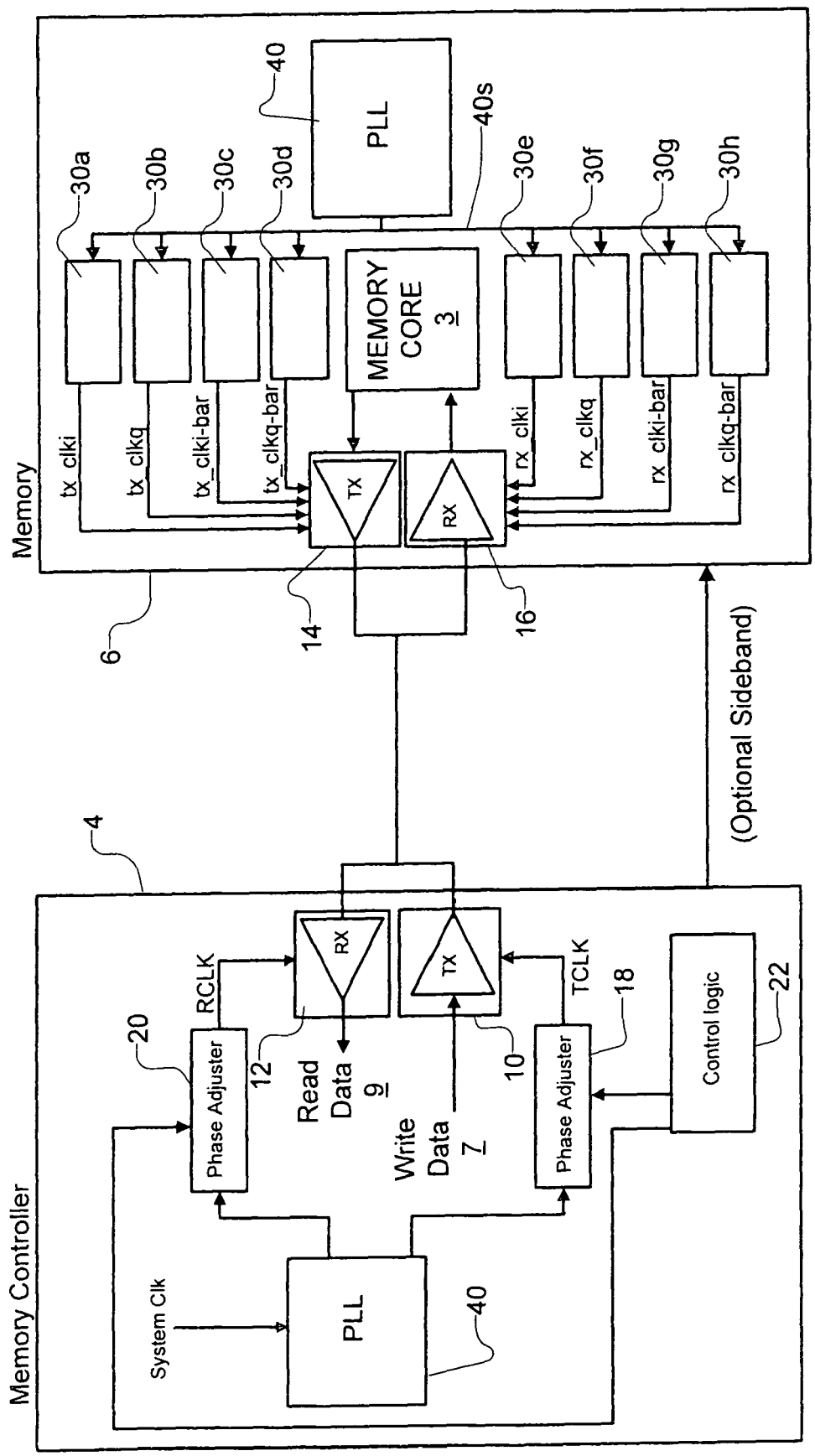
FIG. 2 is block diagram of an example embodiment implementing clock skew correction in an optional sideband control of a quadrature clocking system.

In order to independently regulate or otherwise distinctly implement a correction to a phase of each transmit and receive clock signal on its clock path to the transmitter circuit 14 or receiver circuit 16 in the event of a skew of any of the signals, clocking means or clock signal generator circuit blocks 30 are implemented in the memory circuit for each clock path. Thus, as shown in FIGS. 1, 2 and 3, memory 6 has a clock signal generator circuit block 30 for each clock path. Each such clock signal generator circuit, based on an input clock signal 40s, can generate an output clock signal that can have a different phase from the input clock signal. Thus, in FIG. 1, clock signal outputs of timing circuit block 40 are input to each clock signal generator to generate the receive clock signals Clk_Rx_ (n/2)+1 . . . n and transmit clock signals Clk_Tx_1 . . . (n/2).

As shown in greater detail in the quadrature example of FIG. 2, clock signal generator circuit block 30a controls the phase of transmit clock signal tx_clki and clock signal generator circuit 30e controls the phase of receive clock signal rx_clki. Similarly, the clock signal generator circuits 30b, 30c, 30d, 30f, 30g, 30h can each control the phase of its respective clock signal (i.e., tx_clkq, tx_clki_bar, tx_clkq_bar, rx_clkq, rx_clki_bar and rx_clkq_bar).

As illustrated in still more detail in FIG. 3A, clock signal generator 30 may be formed by a supply voltage regulator circuit block 32 and an adjustable delay circuit block 34 that collectively serve as a controllable phase adjustment means. The voltage regulator circuit block or voltage regulator means regulates its output voltage signal 36 at a desired voltage level based on an input reference voltage level VREF. Preferably, the voltage regulator has a good power supply rejection ratio and a fast load regulation. The delay circuit block 34 acts as a buffer and may include inverters, capacitors and one or more operational amplifiers. In the shown embodiment, a plurality of the inverters 38 are controlled by the voltage output Vreg of the supply voltage regulator circuit 32 and serve to provide a controllable delay to an input clock signal 40s ("VCO Clk"). Alternatively, the clock signal generator 30 may include a PLL or DLL circuit.

The output voltage signal 36 can be dynamically set to a desired level by a digitally controlled gain circuit 43 coupled in a feedback relationship with the output voltage signal 36 of the voltage regulator circuit 32. By increasing the voltage level (Vreg) of the output voltage signal 36, the delay implemented by the plurality of inverters 38 is decreased. By decreasing the voltage level (Vreg) of the output voltage signal 36, the delay implemented by the plurality of inverters 38 is increased. In this way, a phase correction to clock signal output by the clock path may be implemented by changing the delay of the clock signal.

Figure 3B:
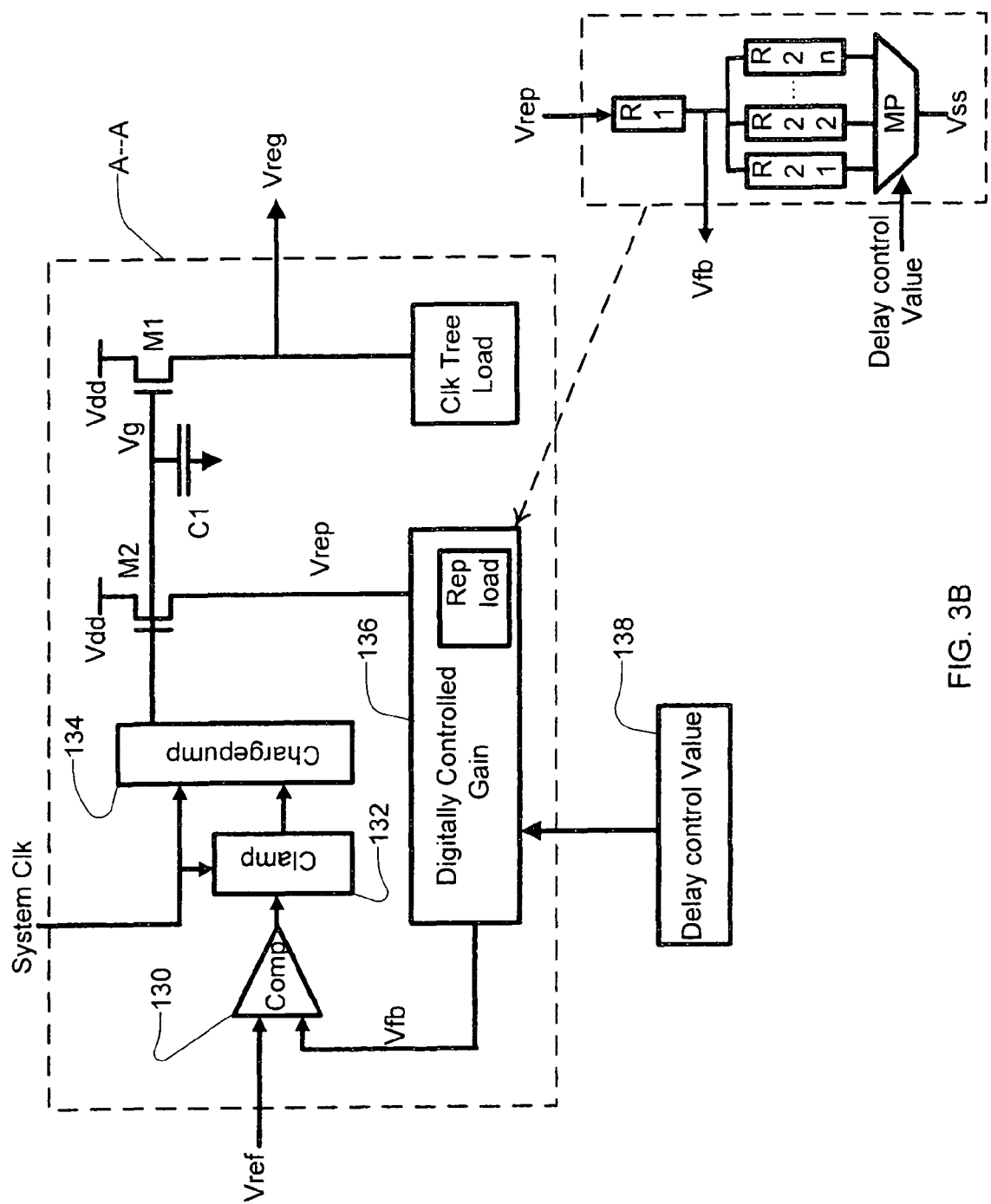
FIG. 3B shows in more detail an example voltage regulator usable with the circuit of FIG. 3A as illustrated by section lines A-A of FIG. 3A.

In one embodiment, the voltage regulator may be constructed with a comparator circuit 130, a clamp circuit 132 and a charge pump circuit 134 coupled with the digitally controlled gain circuit 136 in a replica loop feedback fashion as illustrated in FIG. 3B. In this embodiment, the feedback voltage Vfb is compared to a reference voltage Vref in the comparator circuit 130. The clamp circuit coupled to the output of the comparator prevents high voltage across the transistors M1, M2. The charge pump circuit prevents low dropout.

As shown in FIG. 3B, the feedback signal Vrep from transistor M2 is input to the digitally controlled gain circuit that is an adjustable replica load. Using the adjustable replica load rather than the output load (Clk Tree Load) permits voltage stability independent of the output load. Essentially, the adjustable replica load is a voltage divider having first and second resistors R1, R2 with one of the resistors being dynamically settable by a digital delay control signal 138. For example, the control input may control a multiplexer circuit MP to select one of several inputs of varying resistances $R2_1$, $R2_2$, $R2_n$ as illustrated in FIG. 3B. Other conventional means for implementing a controlled delay or phase adjustment of the supplied clock signal may also be utilized in the memory 6.

As further illustrated in FIGS. 1 through 3, the memory 6 also includes a memory core 3 with cells for storing data. The memory 6 will typically include additional circuitry (not shown) such as buffers, address decoders and the like, which may be connected between the memory core and the memory transmitter and receiver. This additional circuitry may include components responsive to control instructions, including address instructions, for routing data received by memory receiver 16 to particular memory cells during a writing operation and to select particular memory cells and convey the data from those cells to memory transmitter 14 during a read operation.

Additionally, as will be discussed in more detail herein, the memory 6 includes control logic circuits to implement a calibration mode response state block 52. The logic circuits of this block implement setting or reading of the delay data of the memory for each clock signal generator of the memory in response to instructions from the memory controller 4. The logic circuits of this block may also implement transferring and/or receiving the delay data between the memory and memory controller by the transmitter circuit 14 or receiver circuit 16. Optionally, such a transfer may be made on the control channel 24. The delay data is used to provide the digital delay control signal 138 to the digitally controlled gain circuit 136. The delay data may optionally be stored in one or more latch circuits or delay data registers 44 of the response state block 52 or clock signal generator circuit blocks 30. Alternatively, such data may be stored in a portion of the data cells of the memory core 3.

The control logic circuits that implement the calibration mode response state block 52 are also configured to route test data 54 as an test data signal from the memory to the transmitter circuit 14 so that the test data will be sent to the controller in an output signal of the transmitter 14. Alternatively, such test data may be initially sent from the controller to the memory and then resent from the memory to the controller. A test data sequence of such a signal may be an alternating data sequence over a chosen number of bits, such as test sequence of "1010 . . . " or "0101 . . . ". Optionally, the test data sequence may also be preceded by leading data bits such as a non-alternating "00000" data sequence or "11111" data sequence so that the receiving circuit can detect the start of the alternating test data sequence. Similarly, the end of the test signal may be succeeded by such a non-alternating data sequences to assist with detection of the end of a test data sequence. The calibration mode response state block 52 may be configured to initiate the transmission of the first bit of the test data portion of the transfer from the memory in conjunction with a known predetermined clock signal such as the rising edge of a particular clock (e.g., tx_clki) so that the receiving circuit may accurately associate the first edge of the first data eye with that particular clock signal for later adjustment of that clock signal.

Returning to the components of the memory controller, as shown in FIG. 1 the memory controller includes a control circuit block 22 or controller means for generating control signals which control the operating modes of the components in memory controller 4 and memory 6. Thus, the control circuit block generates control signals to set the states of the memory controller components such as the phase adjuster circuit 18 and 20, the transmitter 10 circuit and the receiver 12. Moreover, the control circuit is arranged to send control signals to the memory 6 to control its operations either by way of an optional control channel 24 between the circuits and/or by way of the channel 8. For example, the control circuit block 22 will typically include read/write control logic circuit block 28 to actuate the operations required for writing data into the memory and for reading data out of the memory. Control instructions may also include the addressing information that may be necessary for accessing certain cells of the memory to be written or read.

Aside from the particular data transfer operating modes of the device, the memory controller control circuits may also include instructions for test, calibration and/or setup mode(s) for configuration and/or testing of the memory circuit to implement relative clock measurement and correction modes as discussed in more detail herein. To these ends, the control circuit block 22 includes control logic for implementing relative clock timing measurement and correction of a duty cycle error or phase error between two or more clock signals of the memory circuit. For example, the four transmitter clock signals (tx_clki, tx_clkq, tx_clki_bar, tx_clkq_bar) of the input/output circuits of the quadrature memory 6 system of FIG. 2 may be adjusted in the memory 6 by components of the memory controller 4 so that the relative phase of the four signals of each input or output device remains substantially in a quadrature relationship (i.e., approximately 90 degrees out-of-phase) with respect to each successive clock signal. With such a relationship between the memory controller and the memory, memory design can be kept simplified without substantial measurement components while still allowing for dynamic adjustment of the clock signals along different clock paths of the memory.

Thus, the memory controller 4 includes a first measuring circuit 42 or relative clock timing measurement means that measures the relative timing of clock signals associated with a transmitter circuit 14 of the memory. First measuring circuit 42 includes a multi-clock recovery circuit block 46 with a clock offset detection circuit block 48. The multi-clock recovery circuit block 46 is configured to accept samples from a received test data signal that have been transmitted from the memory 6. The multi-clock recovery circuit block 46 essentially detects data eye boundary transitions from the input test data signal by detecting one or more changes in the received signal such as low to high changes and/or high to low changes. The detection of successive transitions is considered an indicator of a relationship between successive clock edges in the transmitter of the memory. Such a transition detection circuit may be implemented with one or more exclusive-or gates configured to compare a current sample with an immediately prior sample buffered by inverters. Other conventional circuits for detecting such transitions may also be utilized as transition detecting means.

Based on input transitions detected by the multi-clock recovery circuit block 46, the clock offset detection circuit block 48 is configured to determine and compare phase offsets or spacing between successive transitions. For example, the clock offset detection circuit block 48 may implement counting of the number of samples from the input test signal that are between successive transitions. Since each sample is taken at certain time intervals, counting samples is an indicator of time between transitions. Each of the counts between transitions may be stored for a later comparison between them or computations based on them with the calibration control logic circuit block 50 of the memory controller. For example, they may be compared to determine equality or differences between one another to within a predetermined tolerance. Conventional counter circuit elements and number comparing means formed by logic gates, such as an arithmetic logic unit (ALU), may be utilized to implement these circuit blocks.

In the memory controller 4 a second measuring circuit 56 or relative clock timing measurement means is also provided that measures the relative timing of clock signals associated with a receiver circuit 14 of the memory. Second measuring circuit 56 includes a phase sweep data transmission control circuit 58 and a test data comparison circuit 60. Acting as a transmit control means, the phase sweep data transmission control circuit 58 includes control logic elements that are configured to control a repeated transmission of a test data sequence signal from controller test data 17 to the memory using an incremented phase shift of the memory controller clock for each successive test data sequence signal. Such transmissions are made by controlling the phase adjuster circuit 18 to adjust the phase of the memory controller transmitter clock MC_Clk_Tx. The phase sweep data transmission control circuit controls these transmissions of the test data sequences to cells of the memory like a write operation and will subsequently control a read operation from the memory of each test data sequence for further analysis by the test data comparison circuit 60.

The test data comparison circuit block 60 includes control logic elements that are configured to generate a pass or fail comparison result data bit sequence. This result data bit sequence is based on comparing each data bit of the received test data sequences from the memory with each respective data bit of the transmitted test data sequence that was actually transmitted to determine whether the data bits of the received data sequence are the same as the data bits of the transmitted data sequence or not (e.g., a pass bit ("1") for each bit that is the same or fail bit ("0") for each bit of the received test sequence that is not the same). As will be discussed in more detail herein, the test data comparison circuit 60 is further configured to examine the data bits of the comparison result data bit sequence to detect relative timing or phase offsets of multiple clock signals from the transitions of the pass/fail result data bit sequence (e.g., "1" to "0" transitions). A common set of pass to fail transition results from two successively transmitted test data sequences may be taken as an indication of correct alignment of the relative phases of the clocks of the receiver 16 of the memory (e.g., comparison results "1111" and comparison results "0000" for two successive tests of a quadrature clocking system). A mixed set of pass to fail transition results from two successively transmitted test data sequences may be taken as an indication of incorrect alignment of the relative phases of the clocks of the receiver 16 of the memory (e.g., comparison results "1110" and comparison results "0000" for the quadrature clocking system). Essentially, as the phase of the transmitted data sequence from the memory controller changes in each successive test, the phase of the transmitted sequence of data eyes will eventually transition from a state of data recognition success in the memory to data recognition failure in the memory. By examining the bits of the results sequence for each respective clock for successive tests, corrections to any particular receiver clock of memory can be determined and made so that adjustments of the relative timing of the clocks can be made. If some results bits transition while others do not between test sequences (i.e., a presence and absence of transitions), this can be taken as an indication that adjustments need to be made. Conventional transition detectors, comparison circuits or ALUs formed by typical logic gates may be utilized to implement these circuit blocks.

Figure 4:
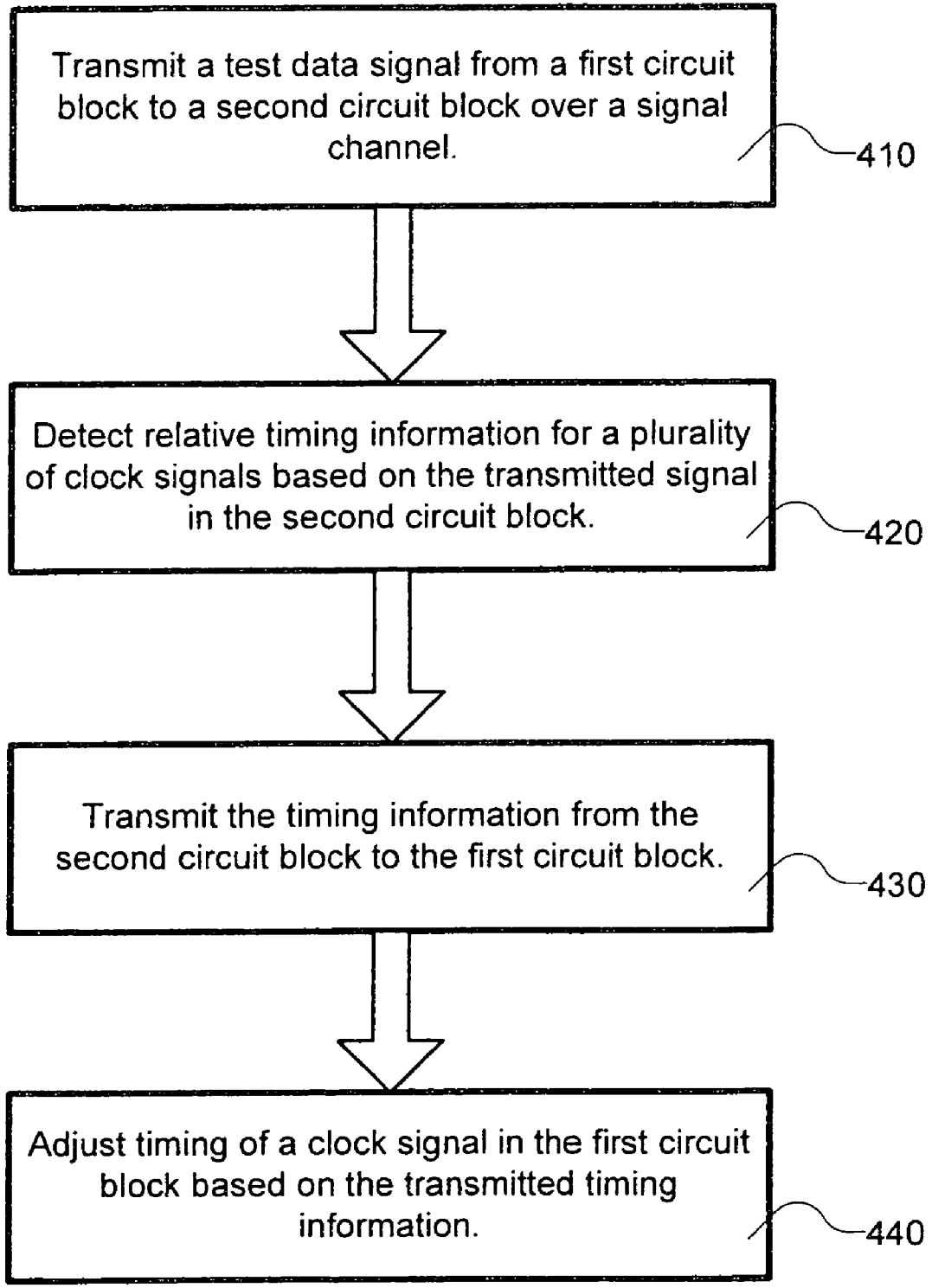
FIG. 4 is a flow chart with a process for correcting clock skew.

Operation of either of the measuring circuits 42, 56 in conjunction with flow control logic of the calibration mode control logic circuit block 50 to measure relative timing of the clock signals of the transmitter circuit 14 of the memory or the clock signals of the receiver circuit 16 of the memory may be better understood upon consideration of process details shown in FIGS. 4 through 11. As illustrated in FIG. 4, the measuring and correcting operations of either the first measuring circuit or second measuring circuit in conjunction with the calibration mode logic control logic block 50 and the calibration mode response logic state block 52 may include the following general steps. The first circuit or memory 6 transmits a test data signal along the data channel 8 to the second circuit or memory controller 4 in step 410. The memory controller then detects relative timing information associated with the clock signals of the memory in step 420. Timing adjustment information is then sent back to the memory from the controller in step 430. Finally, the memory circuit adjusts the timing of one or more clock signals of the memory 6 using the transmitted timing adjustment information in adjustment step 440. In this way, a duty cycle or quadrature phase error of the clock signals of the memory may be measured and adjusted by the memory controller to minimize any undesirable skew of the signals.

A. Control Logic Measuring Operations for Correcting the Memory Transmitter Clocks Operations of the first measuring circuit 42 in conjunction with flow control logic of the calibration mode control logic circuit block 50 to measure relative timing of clock signals of the transmitter circuit 14 of the memory will now be discussed in reference to the processes shown in FIGS. 5 through 8.

Figure 5:
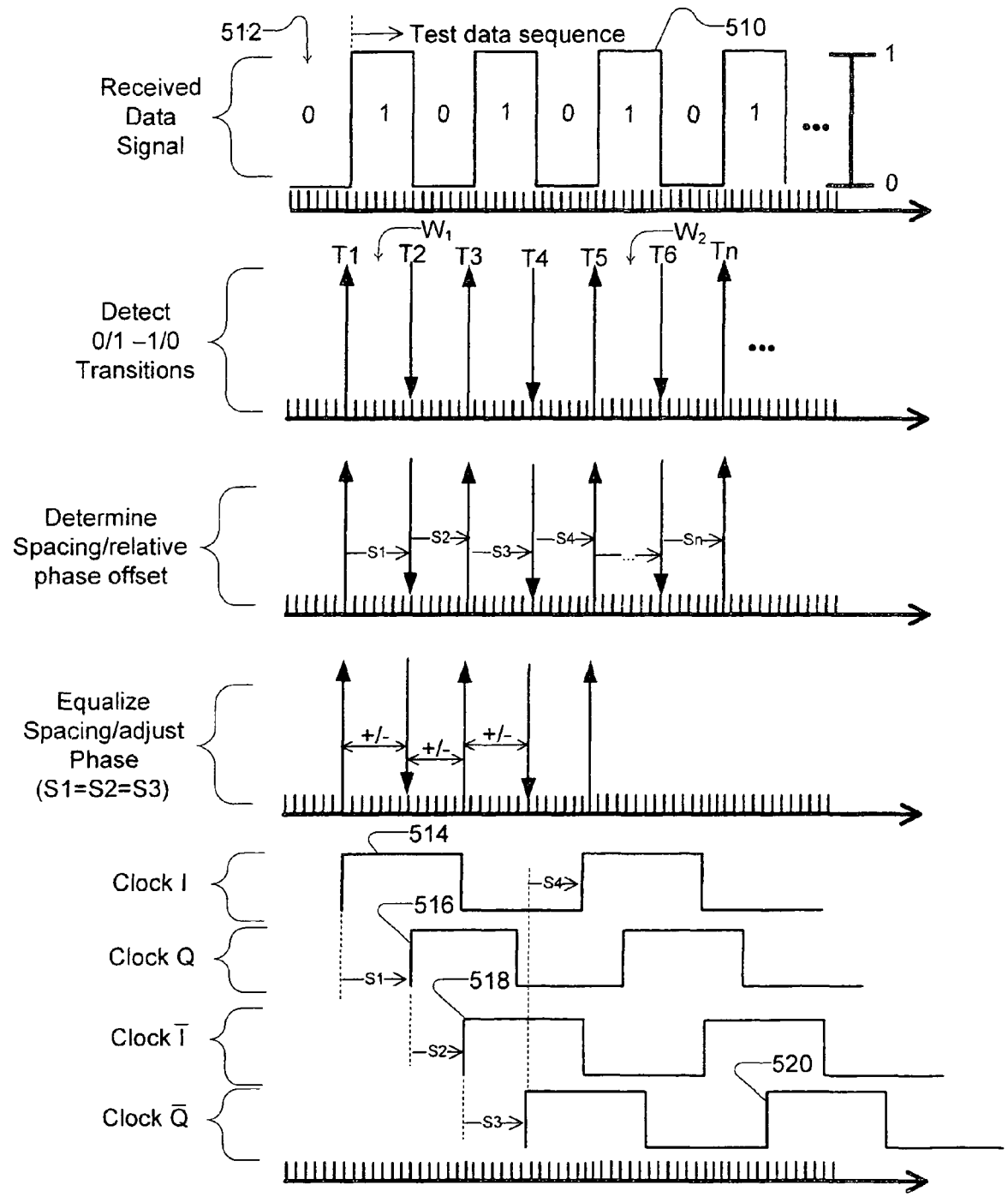
FIG. 5 is a graphical illustration of a process for correcting clock skew with transmitted data signals of a quadrature system.

FIG. 5 graphically illustrates a receive clock measuring process. The example test data signal 510 is a repeating "1010" data pattern. A "0" preceding signal 512 precedes the test pattern when transmitted from the memory 6 to the memory controller 4 to permit the controller to detect a particular first transition at the start of the test sequence. Only a single preceding 0 bit is illustrated for simplicity purposes. Such a test transmission can be initiated by the calibration mode means or calibration control logic circuit block of memory controller 4 sending a test mode initiation instruction or other such control instructions to the memory 6 to set the memory for responding. As illustrated, the memory initiates the first high bit of the test transition mode in synchrony with the first rising edge of clock signal 1514. The three subsequent bits of the test data signal each begin in synchronism with the rising edge of each of the clocks Q 516, I-bar 518 and Q-bar 520 respectively.

Upon initiation of the test mode, the memory controller 4 controls the clock phase adjuster circuit to adjust the memory controller receive clock MC_Clk_Rx rate to sample the incoming data signal at a higher rate than the rate used to transmit the test data signal in the memory. This permits a sampling of the incoming data signal at a sufficiently detailed resolution for detecting test data signal transitions (e.g., 0 to 1 and 1 to 0) and determining the time between the transitions. Alternatively, the incoming data signal may be buffered to delay the test data signal so that it may be sampled at short sample intervals while still using a receive clock rate in the memory approximately equal to that of a normal or typical rate of data reception. As a further alternative, a simple receiver clocked by the desired sampling rate may be used to receive and sample the test data signal.

The memory controller then detects successive transitions T1, T2, T3, T4, T5, T6, . . . Tn with the multi-clock recovery circuit 46 from the received test data signal that are each associated with the rising transitions of the successive clock signals of the memory (e.g., the rising edges of clocks I, Q, I-bar and Q-bar) as shown in FIG. 5. In practice, the actual start time of each rising edge of each clock signal will not be at the same time as the detected edges of the data valid window when the test data signal is received due to data propagation delay associated with the channel 8. However, since the measure of timing is a relative one, the rising edges of clocks I, Q, I-bar and Q-bar may be taken from the relative timing of successively received data valid windows without consideration of propagation delay of the channel since it may be assumed that the propagation delay is constant for each data bit of the transmitted test data signal.

As further illustrated in FIG. 5, the spacing or time intervals S1, S2, S3, S4, Sn between successive detected transitions may be determined by counting samples between the successive transitions to determine relative phase offsets between the clocks I, Q, I-bar and Q-bar. These measured phase offsets can subsequently be compared or analyzed to make adjustments in the clock generators 30a-30h (FIG. 2) to equalize these space or time measurements that represent the relative phases of the transmit clocks of the memory.

In this quadrature example of FIG. 5, a four bit test data signal is shown and can be sufficient for determining the relative phase relationships between all of the transmit clocks of a transmitter. However, additional four bit test sequences may also be used in such a system. By averaging the time or spacing counts for every fourth transition window (e.g., $W_1$ and $W_2$) for each clock determined from successive data sequences, the average times or spaces can be compared and used to make adjustments to the phases of the clocks of the memory 6. In this way, transient noise of the system that may affect a particular timing measurement sequence can be minimized.

Adjustments for the memory clocks may be calculated or determined by the control circuits of the calibration mode logic block 50. In one embodiment, calculations for making phase adjustments to the memory transmitter clocks may include determining the time or number of samples that a particular clock is out of relative phase and retrieving appropriate delay data values based on a lookup table of the memory controller or memory and setting the delay data registers accordingly.

Finally, acting as a transmit control means in the memory controller the block 50 may control a transmission of the adjustments to the memory for placement in the appropriate delay data registers 44. As illustrated in the quadrature example of FIG. 5, at most only three clock signals would need to be adjusted. Although, adjustments can be made to all four clock generators of the memory or to as few as one clock generator depending on the measurement results. If these phase offsets are determined to be equal, no adjustments to the transmitter clock phases would need to be made in the memory if the desired relative timing relationship between the clocks is equality.

Figure 6:
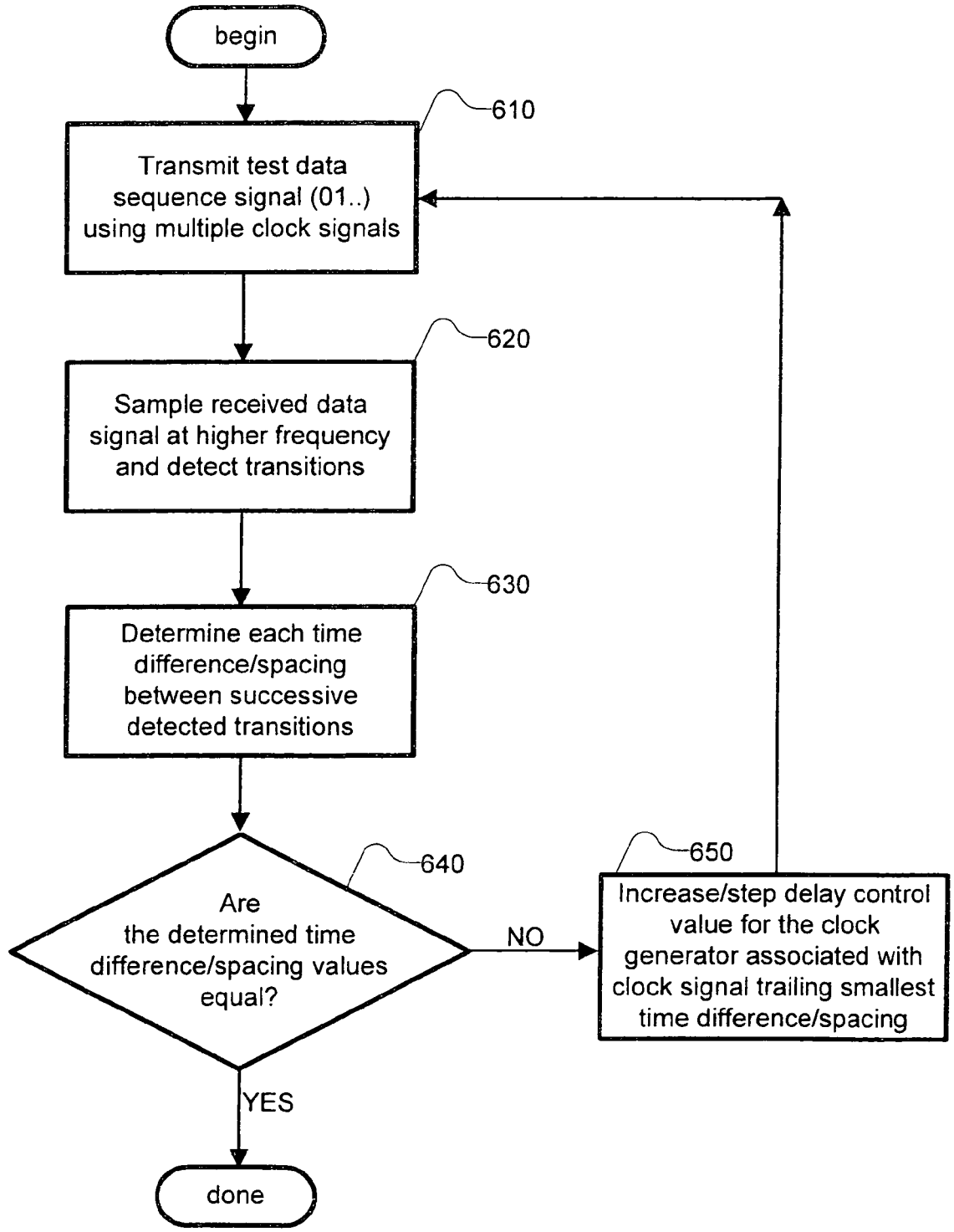
FIG. 6 is another flow diagram of example steps in an embodiment of the method of FIG. 5.

In another embodiment of the phase measuring and correction process implemented by the circuits of the memory controller and the memory to align the transmit clocks of a transmitter 14, adjustments may be made by a closed loop testing process as detailed in FIG. 6. In this embodiment, a test data signal is transmitted from the memory to the controller in a transmit step 610 in the manner previously described. Similarly, transitions are detected and spacings or offsets are determined in steps 620 and 630 in a manner previously described. In step 640, the successive phase offsets or time intervals are compared for equality. If equality exists, then the testing and correction process is complete. However, if equality does not exist in step 650, the smallest spacing or phase offset is determined and the delay control value of the clock signal associated with the trailing edge of that spacing value is retrieved from the memory and incremented to increase its delay. The incremented delay control value is then re-set in the memory's delay control register 44. The process returns to step 610 for retesting. In this manner, an incremental adjustment of each clock signal generator can be made as necessary to gradually correct each relative phase until each of the determined spaces for the detected transitions are equal and thus, the relative phases of each clock signal are in their desired alignment.

Figure 7:
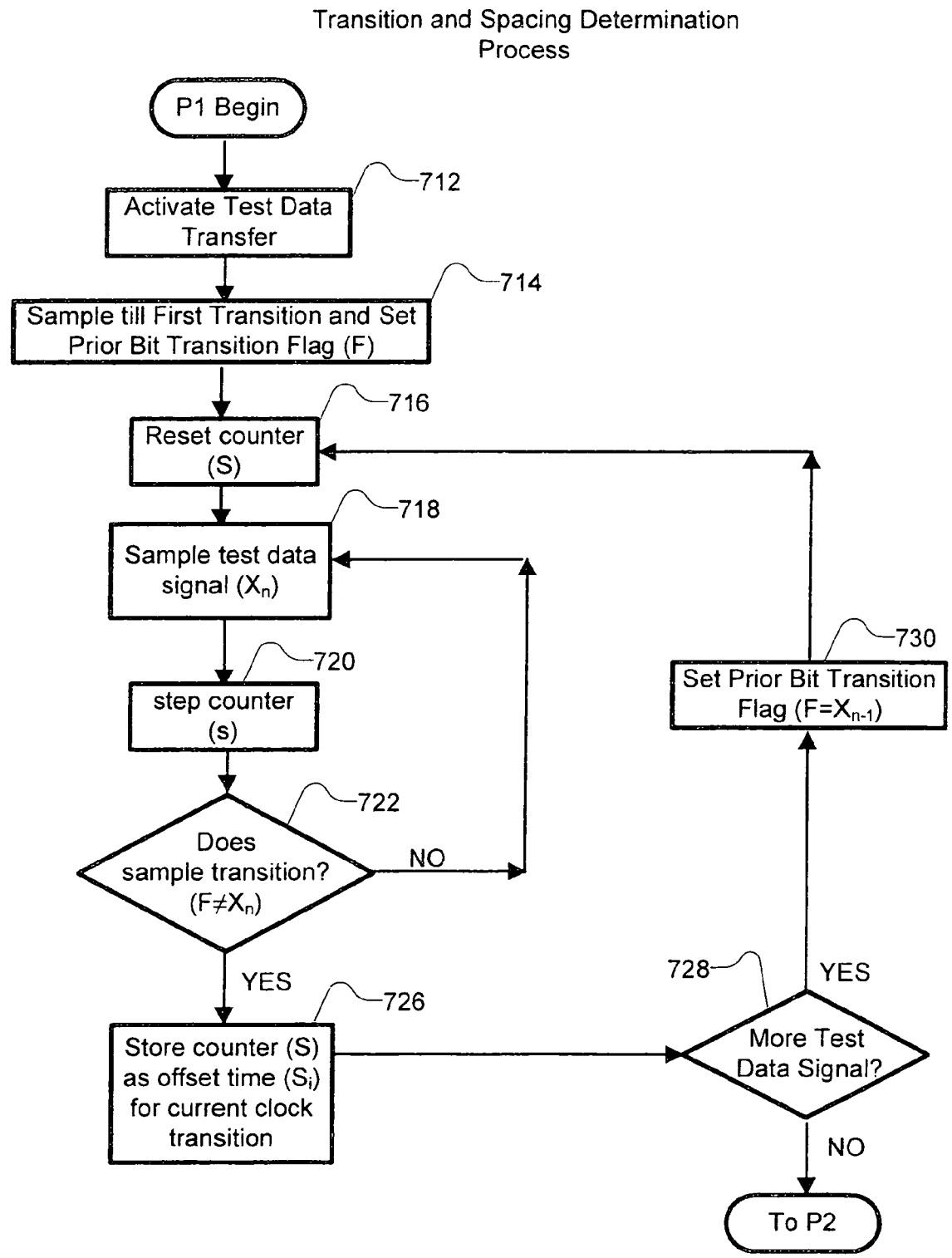
FIG. 7 is a further flow diagram of example measuring steps in the process of FIG. 6.
Figure 8:
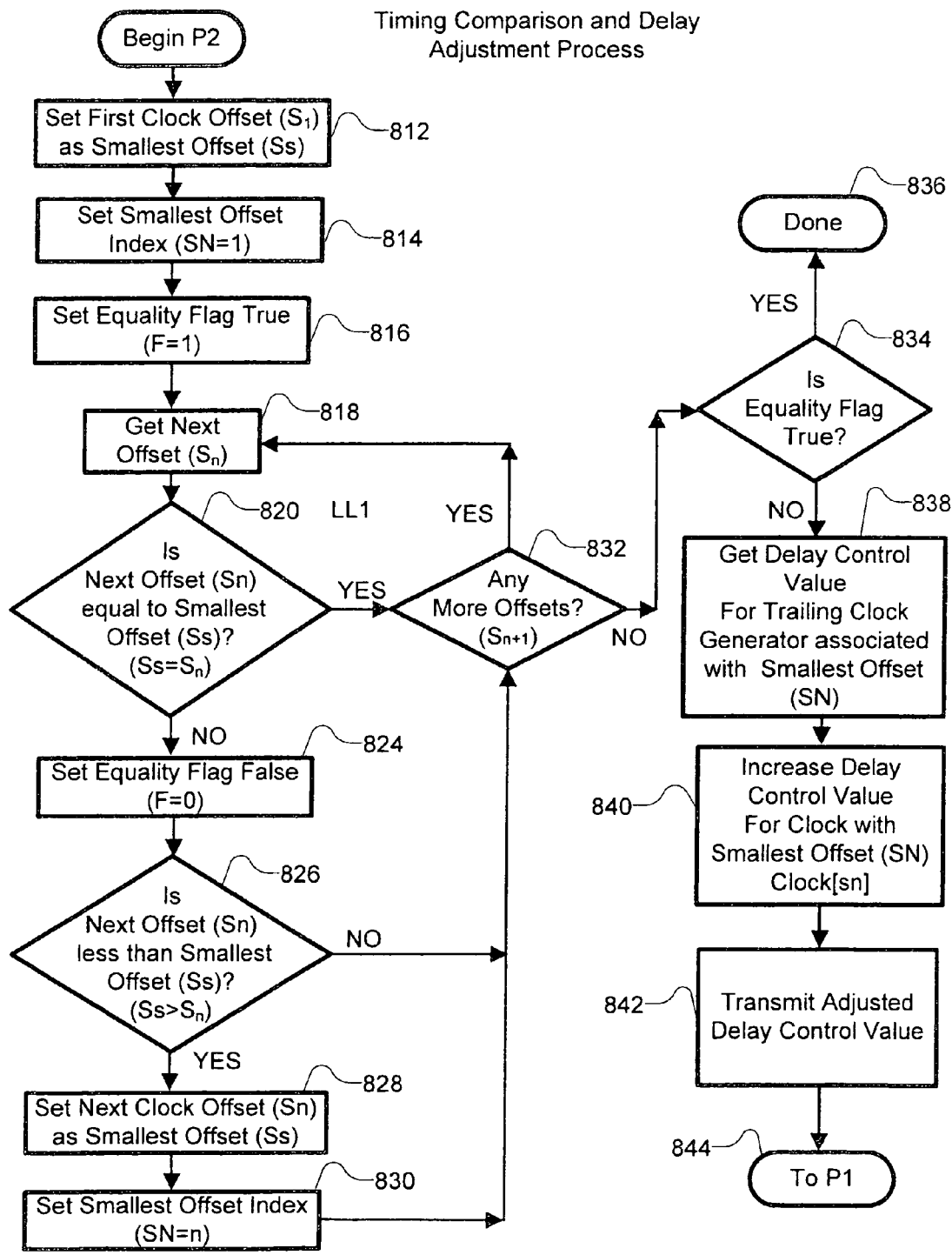
FIG. 8 is a further flow diagram of example correction steps in the process of FIG. 6.

More detailed flow charts for the process of FIG. 6, is shown in FIGS. 7 and 8. In step 712, the memory controller activates the test measuring process by setting the states of the memory controller and memory and the memory transmits a test data signal. In step 714, a received data signal is sampled by the memory controller. Sampled values that have the same digital value as the preceding bits are initially ignored. When a first transition of the test data signal is detected, the prior bit transition flag is set. The value would be high if the test signal is a "1010" type test data signal or low if the expected test signal is a "0101" type test data signal. The flag represents the prior bit the first value of the first bit in the test sequence. For example, in FIG. 5 the first sample value would be "0" taken from a first portion of preceding signal 512. The flag is used for detecting subsequent transitions (e.g., "0" to "1" changes). In step 716, a counter S for measuring spacings or timing between transitions is reset to zero.

In step 718 a sampled test data value Xn is received. In step 720 the counter is incremented by one. In step 722, the sampled value is compared to the prior bit transition flag. If the prior sample of the flag and presently sampled value are equal, then control returns to step 718. In step 722, if the currently sampled test data value Xn is not equal to the Prior Bit transition flag, then a transition has been detected and control moves to step 726. In step 726, the value of the counter S represents the timing between the current transition and the prior transition. The counter value is stored. If in step 728 there are no more bits in the test data signal, then the process proceeds to P2 for comparison and adjustment of these determined phase offsets. Otherwise, the process continues in step 730 by setting the prior bit transition flag with the presently sampled value and then resetting the counter S to zero for measuring of the next phase offset in step 716.

The timing or phase offset comparison and delay adjustment process of the process of FIG. 6 is shown in FIG. 8 beginning with P2. In step 812, the first spacing or clock offset $S_1$ is preset or presumed to be the smallest $S_s$ of the determined spacing values. In step 814, a smallest offset index is also preset to 1 to associate the smallest offset with the particular clock signal of the memory that can be adjusted to change the spacing value of the smallest offset. In step 816, an equality flag is set high to track equality of all of the spacing values.

In step 818, the next spacing value Sn or offset is retrieved. The next spacing value Sn is compared to the smallest offset Ss for equality. If the offsets are equal and there are more offsets in step 832, flow returns to get the next offset in step 818. Loop LL1 will repeat if all determined offset or spacing values Sn are equal until there are no more such that flow proceeds to step 834. For a quadrature system, this would loop three times. In step 834, the equality flag is examined. If it is true then no adjustments need to be made to the clocks of the memory and the process is done in step 836 because the clocks signals of the memory have been determined to be in the expected phase relationships.

In step 820, if the smallest offset and next offset are not determined to be equal, process moves to set 824 to set the equality flag low indicating that measured spacings are not equal. In step 826, after being compared for equality, the Next Offset Sn is compared to the Smallest Offset Ss to detect if it is the smaller of the two. If it is, in steps 828 and 830, the new Smallest Offset value is set to the smaller spacing value and the Smallest Offset Index Sn is associated with the new smallest offset or spacing values Ss. Flow then continues to step 832 to repeat if further spacing values exist. In step 826, if the compared Next Offset/spacing value Sn is not smaller than the Smallest Offset value Ss, then the control returns to step 832 without resetting the smallest spacing value.

In step 834, if the offsets are not equal flow will proceed to step 838 for correction of the clock associated with the smallest spacing detected during the comparison process just described. Thus, in step 838, the delay control value for the clock generator the controls the clock signal at the trailing edge of the smallest measured spacing or offset is retrieved. In step 840, the retrieved delay control value is increased or incremented to increase a delay of the appropriate clock generator. In step 842, the new delay control value is transmitted to the memory from the memory controller for setting the clock generator. In step 844, the process returns to P1 to re-measure and determine spacing equality or inequality. In this way, the clock generators may be incrementally controlled as necessary until the desired relative phase relationship is achieved. Thus, a duty cycle error of a memory transmitter's clock signals' can be adjusted or, in the example of a quadrature system, the quadrature phase error may be corrected by the memory controller.

B. Control Logic Measuring Operations for Correcting Memory Receiver Clocks

Operation of the second measuring circuit 56 in conjunction with flow control logic of the calibration mode control logic circuit block 50 to measure relative timing of clock signals of the receiver circuit 16 of the memory will now be described in reference to the processes illustrated in more detail in FIGS. 9 to 11.

Figure 9:
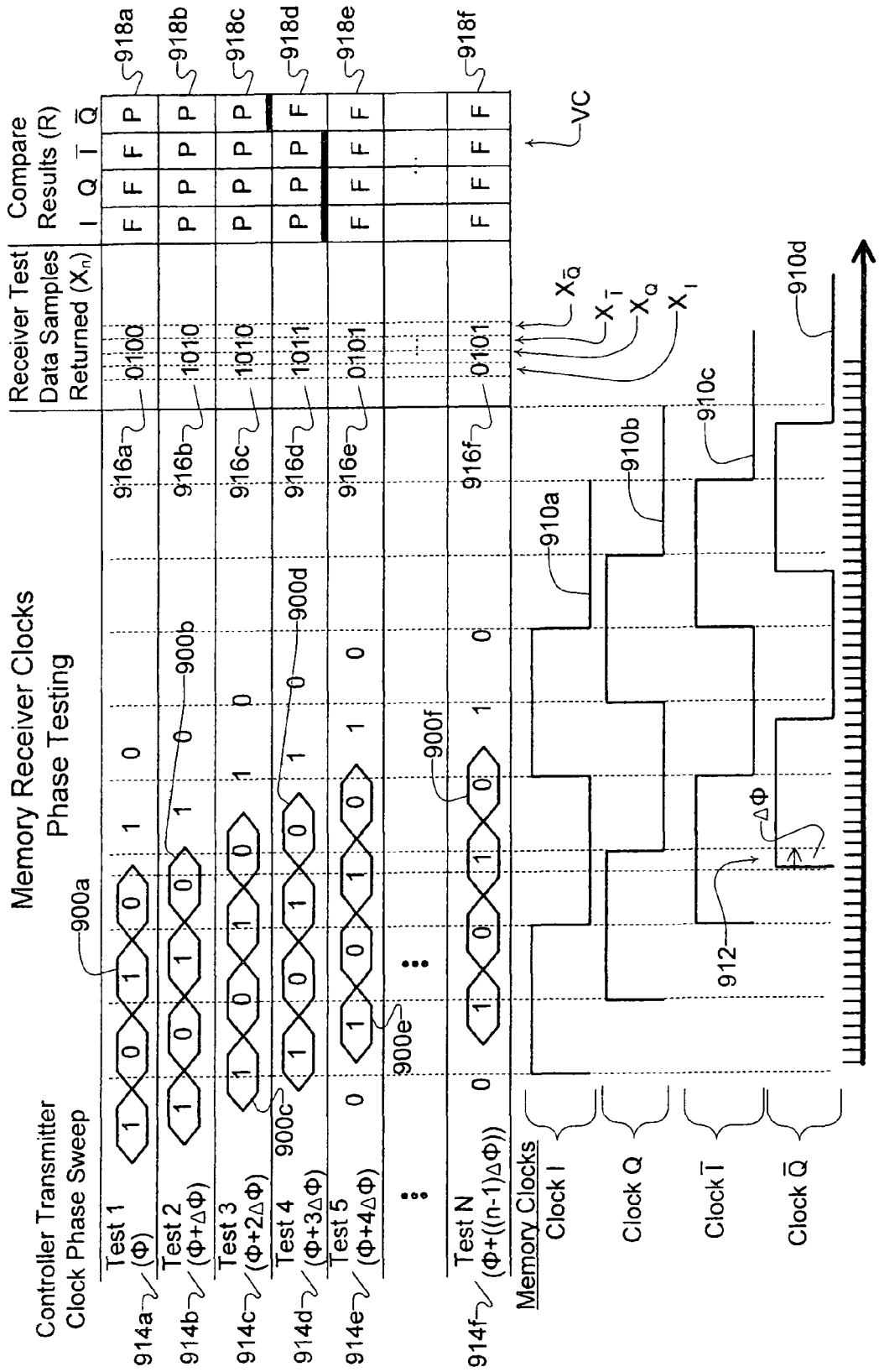
FIG. 9 is a graphical illustration of another process for correcting clock skew with transmitted data signals of a quadrature system.

FIG. 9 is a graphical illustration of an example memory receiver clock measurement and correction process implemented by the circuit components previously discussed. FIG. 9 shows test data sequences 900a, 900b, 900c, 900d, 900e, 900f transmitted by the memory controller 4 to the memory 6. The example sequences are alternating "1010" data sequences. While extra bits may optionally be sent to pad preceding or succeeding bits, four bits are examined in each test of this example since four consecutive bits will be sampled by each of the different clocks of the quadrature clocking system of the memory receiver. The four quadrature receiver clock signals 910a, 910b, 910c, 910d of a memory are also shown on a common time axis to illustrate their sampling relationship with the test data sequence. In this example, clock signal 910d is shown as being skewed or out of its expected phase relationship by a phase deviation 912 having a phase quantity of $\Delta\Phi$.

In the first test 914a, an arbitrary transmit phase $\Phi$ for the signal is chosen and set by the memory controller's phase sweep data transmission control circuit 58 in conjunction with the clock phase adjuster circuit 18. The test sequence is transmitted by the memory controller. The data sequence is received, sampled by the receiver circuit 16 under the control of each clock I, Q, I-bar and Q-bar such that the first sample $X_I$ is taken on the rising edge of clock I, the second sample $X_Q$ on the rising edge of clock Q, the third sample $X_{I-bar}$ on the rising edge of clock I-bar, etc. This first sampled test data 916a may then be stored by the memory.

In order to distinguish between the different clock signals of the receiver of the memory for later timing adjustments by the memory controller, the memory controller's initiation of its transmission of the first test data sequence, or any subsequent one, to the memory is initiated at a time so that the first test bit will be received and sampled using a particular or known one of the clock signals of the memory receiver. With this synchronized initiation of the transmission of the test data sequence, the memory controller can then have a basis for distinguishing which one of the bits of the test data sequence will be associated with which one of the successive clock signals of the receiver of the memory as discussed in more detail herein. Any method for preliminarily determining this initiation time as a function of a reference clock signal of the memory controller can be utilized.

Returning to the first test sequence, after its transmission to the memory, the memory controller then reads back the first sampled test data 916a. Thus, the test data 916a is transmitted from the memory to the memory controller in a read operation. The memory controller with the test data comparison circuit 60 then compares the desired bits of the test sequence 900a ("1010") with the first sampled test data 916a ("0100")

to generate a result bit sequence. Thus, a first test results sequence 918a of "FFFP" or "0001" is generated. This set of result bits sequentially indicates results of the comparison, which are in this example, not the same for each first bit, not the same for each second bit, not the same for each third bit and the same for each forth bit (i.e., "FFFP" or "0001"). In the example, since the initial transmit phase Φ was set early and the clock Q-bar is early by its deviation 912, the result indicates a correct data transmission and reception for the last clock Q-bar. However, the first three results indicate that the first three clocks I, Q, I-bar and Q-bar are not sampling the data in the expected data valid window of the test signal 900a.

The memory controller's phase sweep data transmission control circuit 58 will subsequently control any number of additional tests 914b, 914c, 914d, 914e and 914f as desired to incrementally sweep the phase of the data valid windows of the test data sequence across the receiver clocks. The sampled test data 916b, 916c, 916d, 916e and 916f and the test results sequences 918b, 918c, 918d, 918e and 918f will be determined like the first samples. However, in each successive test, the phase of the clock phase adjuster circuit 18 will be changed, such as by incrementing by a predetermined phase change ΔΦ. This phase change ΔΦ may be determined depending on the desired resolution of the test of the data valid window and the number of desired test sequences to be run.

The data mapped in the results sequences 918a, 918b, 918c, 918d, 918e, and 918f may then be used to compare or measure the relative timing of memory clocks I, Q, I-bar and Q-bar by the memory controller with the test data comparison circuit 60. For example, by reviewing the results sequences 918a, 918b, 918c, 918d, 918e, and 918f to find two successive four bit result sets such that the all of the bits of each set transition from pass to fail (e.g., results$_n$=PPPP and results$_{n+1}$=FFFF) can be an indication that the relative phases of the four clocks are in their expected timing relationship. Successive sets having common fail to pass data sets would be a similar indication (e.g., results$_n$=FFFF and results$_{n+1}$=PPPP). These conditions may be determined by examining the data transition ("0" to "1" or "1" to "0") between every fourth bit, which is an indicator of transition of a particular clock for each such bit in a quadrature clocking system. For example, by comparing result sequence 918c ("PPPP") with successive result sequence 918d ("PPPF") it can be seen that clock Q-bar transitions at a different relative time with respect to the other clocks (I, Q and I-bar) because the last bit of each set transitions while the first three do not. In another example, by comparing transitions of result sequence 918d with its successive result sequence 918e it can be seen that clocks I, Q and I-bar are in their expected relationships with one another because the relative bits associated with each clock changes or transitions from pass to fail at the same test interval (test 914e).

The number of test intervals or the number of phase changes ΔΦ between a particular clock's transition with respect to another is a spacing between transitions that can serve as a relative timing measure by which a particular clock's phase can determined and/or adjusted. Thus, as illustrated by the successive results R of FIG. 9, since result sequences from clocks I, Q and I-bar commonly transition at test 5 (914e) and clock Q-bar transitions at test four (4) (914d), the relative offset of clock Q-bar can be adjusted by the phase change associated with one space or one test interval such as the phase adjustment in amount of ΔΦ or some function thereof. Information for determining such an adjustment of clock Q-bar of the memory can be calculated and/or derived by the calibration mode control logic circuit block 50 of the memory controller from a lookup table using the results sequence.

In another example, the phase of a receiver clock of the memory receiver can be determined from portions of the results data sequence. To this end, the rising edge of a receiver clock may be considered as the center of a result sequence of passing tests results bounded by failing tests results (e.g., "FPPPPF") from multiple test sequences when considering particular result data sequence bits that would be associated with one particular clock. This can be illustrated with the data of FIG. 9. The results data taken from first to fifth rows in vertical column VC would have a results sequence associated with clock I-bar as "FPPPF" taken over tests 1 to 5. From the center "P" of this sequence taken from row three, the result sequence would indicate that the clock I-bar is at a phase associated with the transmitter phase of test three (3) (i.e., Φ+2ΔΦ). Such a center may be determined by counting "P" bits between detected transitions (e.g., "0" to "1" and "1 to "0" or "F" to "P" and "P" to "F"). The phases of all of the receiver clocks may also be determined in this relative fashion by examining the results data associated with each particular clock and finding the test phase associated with the center of each passing sequence bounded by failing sequences of each clock. Each clock can then be adjusted by the appropriate phase deviation so that their centers align at a common center test phase, such as the test phase of test three (3) (i.e., Φ+2ΔΦ).

Any of the determined adjustment timing information can be transmitted to the memory for adjustment of the appropriate clock generator(s) of the memory. Adjustments to multiple clock generators in relation to the one of the clock generators can all be calculated and made in this fashion to correct the relative phase alignments of all of the clock signals of the receivers so that that they will have the desired relative phase relationships based on determining changes for each to set them for common transitions.

Figure 10:
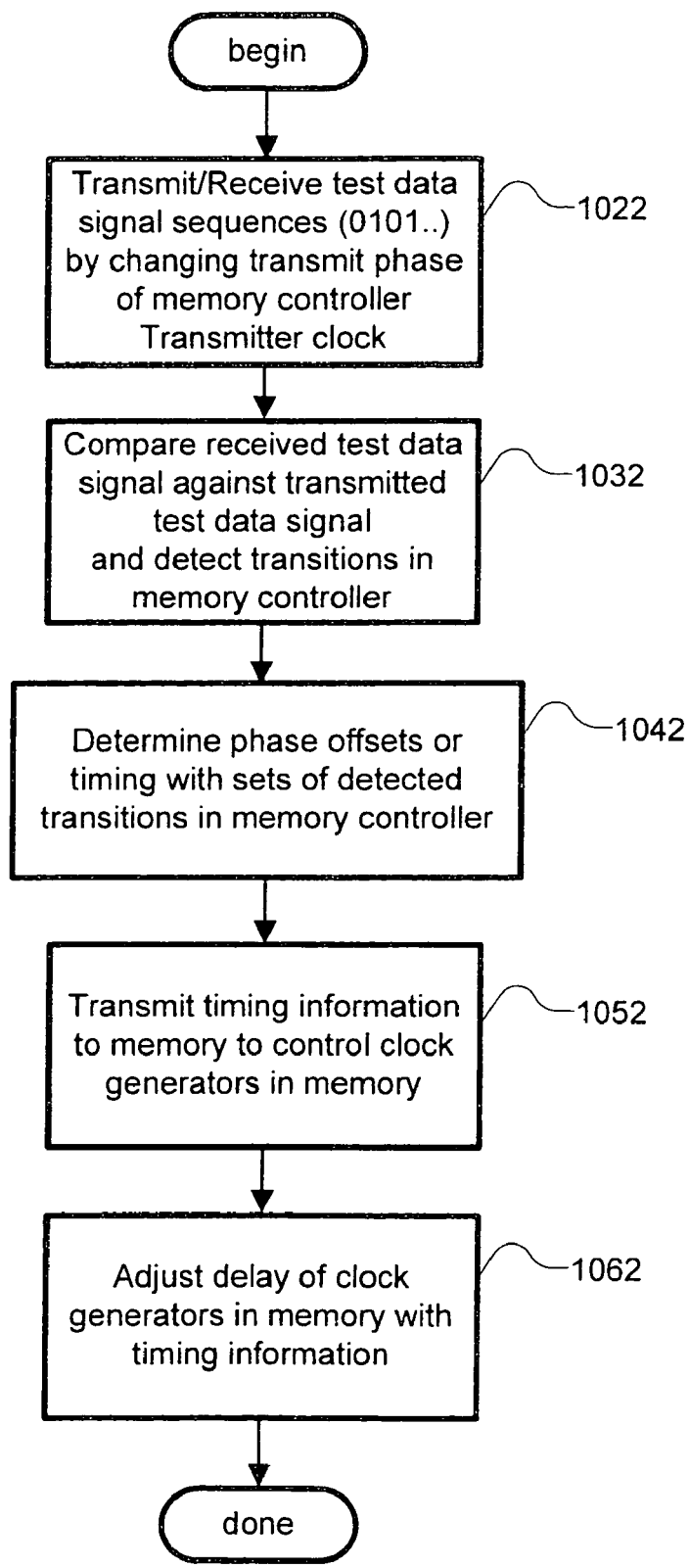
FIG. 10 is a flow diagram showing example steps in an embodiment of the method of FIG. 9.

This measurement and correction process can be summarized by the steps of the flow chart of FIG. 10. In a write and read step 1022, test sequences are successively transmitted and received with incremental phase changes of the memory transmitter clock. In a compare step 1032, test data is compared to the returned sampled data and resulting sets of transitions between test sets are detected. In a determining step 1042, spacing or phase offsets associated with clock signals of the memory are determined from the sets of detected transitions with the memory controller. In a control step 1052, the memory controller transmits timing or phase adjustment information to the memory based on the detected sets of transitions. In an adjustment step 1062, one or more clock generators of the memory are adjusted with the timing or phase set information to change relative phases of the receive clocks of the memory.

Figure 11:
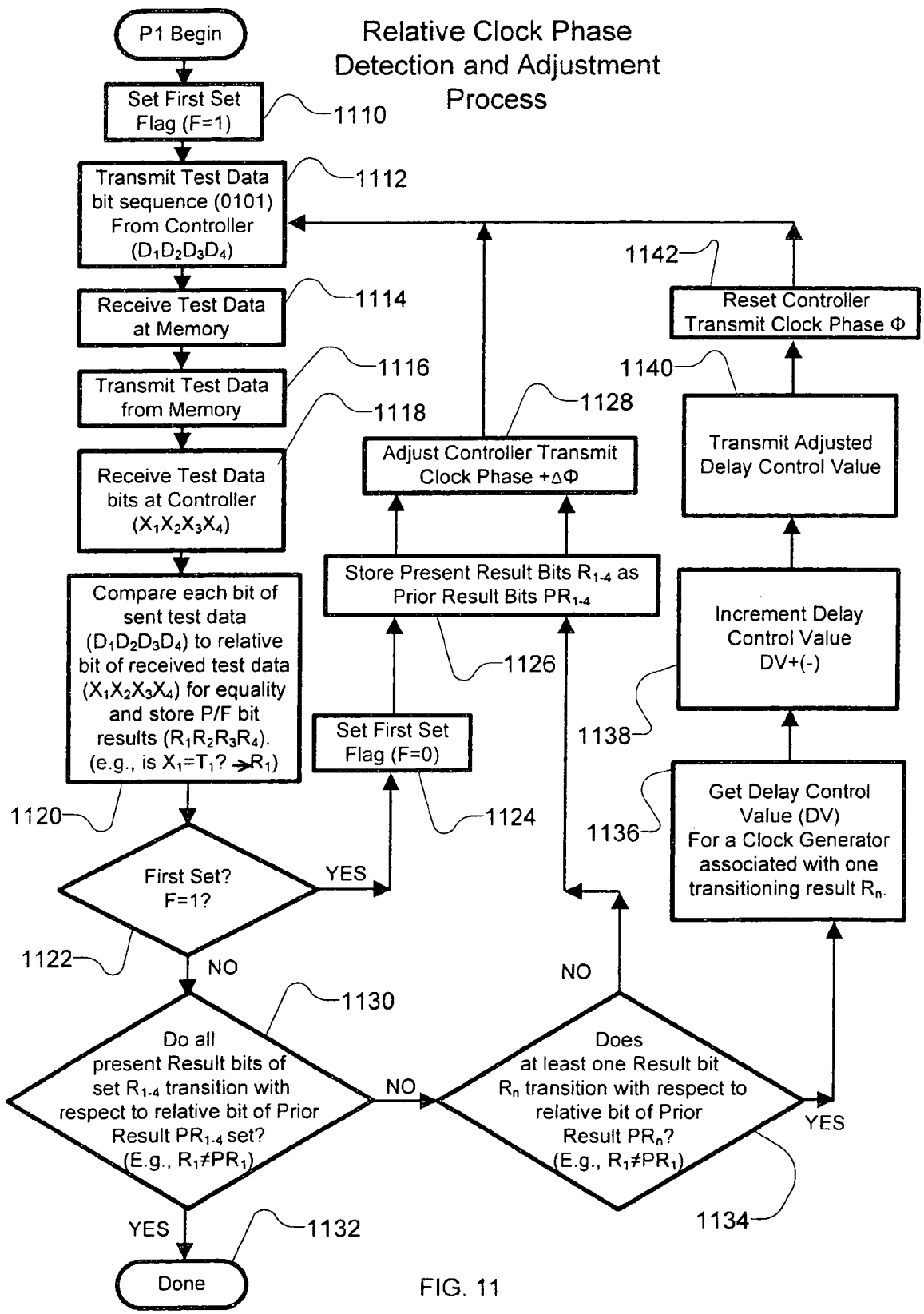
FIG. 11 is another flow diagram of example skew detection and correction steps in an embodiment of the method of FIG. 9.

Such phase measurement and correction may also be implemented in the circuits of the memory controller and memory as a closed loop testing process as shown in the quadrature example of FIG. 11. In step 1110, a First Set flag is set high to indicate that the first test set is beginning. In step 1112, a four bit test sequence set (e.g., $D_1, D_2, D_3, D_4$) is sent to the memory 6 by the memory controller 4 using an original phase setting Φ of the transmitter clock signal. In step 1114, the test signal is received and sampled at the memory using four clock signals. In step 1116, the sampled data signal is transmitted back to the memory controller from the memory. In step 1118, the memory controller receives the sampled data from the test signal (e.g., bits $X_1, X_2, X_3, X_4$). In step 1120, the test sequence bits ($D_1, D_2, D_3, D_4$) are compared to the test sequence bits ($X_1, X_2, X_3, X_4$) and a results set of pass/fail bits ($R_1, R_2, R_3, R_4$) is created.

In step 1122, the First Set flag is examined. If the First Set flag is high, a next test sequence will begin at step 1124 by setting the First Set flag low. In step 1126 the result bits are stored as Prior Result bits $PR_{1-4}$ for later analysis. At step 1128, the transmit clock phase is incremented by M. After step 1128, step 1112 is repeated to begin another test cycle of loop LL2 at the new transmit clock phase to create a new result bit set.

If at step 1122 the First Set Flag is not high, the result bits $R_{1-4}$ are compared to the Prior Result bits $PR_{1-4}$ to see if all bits transition in step 1130. If all bits transition from high to low or low to high (e.g., $PR_{1-4}$="1111" and $R_{1-4}$="0000") then the relative phases of the receive clock of the memory are in their expected quadrature alignment and the process is complete in step 1132. In step 1130, if not all of the current result bits and prior result bits transition (e.g., $PR_{1-4}$="0000" and $R_{1-4}$="1000"), step 1134 determines if a result bit $R_n$ transitions with respect to a prior result bit $PR_n$ (e.g., $PR_1$=0 and $R_1$=1). If no result bits transition (e.g., $PR_{1-4}$="0000" and $R_{1-4}$="0000") then control moves to step 1126 to store the result bits as the prior result bits and to then repeat another test cycle of loop LL2 at a new clock phase adjusted in step 1128.

If in step 1134 at least one bit transitions (e.g., (e.g., $PR_1$=0 and $R_1$=1), in step 1136 a delay control value for the clock generator associated with one of the transitioning bits is retrieved. In step 1138, the delay control value is incremented by some incremental value under control of the memory controller. In step 1140, the adjusted delay control value is transmitted to the memory to be stored in the appropriate delay register for adjustment of the phase of the clock signal from the particular clock generator. In step 1142, the phase adjuster circuit 18 or phase changer is reset to generate the transmit clock of the memory controller at the original phase Φ used in the first test cycle.

With such a cycle, the system will continue to gradually increase a delay of the phase of any clock signal that transitions early with respect to the other clock signals until all of the clock signals transition at the same test interval. In this way, the relative alignment of the signals of the receive clocks used by a receiver 16 of the memory 6 are measured and may be gradually corrected with the memory controller 4 circuit until they are set in their expected phase relationships with one another. Thus, a duty cycle error of the memory's receiver clock signals can be adjusted or, in the example of a quadrature system, their quadrature phase error may be corrected by the memory controller.

In general, each of the circuits and the circuit control logic of the technology presented herein may be constructed with electrical elements such as traces, capacitors, resistors, transistors, etc. that are based on metal oxide semiconductor (MOS) technology and may be arranged in complementary fashion (CMOS). However, they may also be implemented using other technology such as bipolar technology or any other technology in which a signal-controlled current flow may be achieved.

Furthermore, these circuits may be constructed using automated systems that fabricate integrated circuits. For example, the components and systems described may be designed as integrated circuit(s), or a portion(s) of an integrated circuit, based on design control instructions for doing so with circuit-forming apparatus that controls the fabrication of the blocks of the integrated circuits. The instructions may be in the form of data stored in, for example, a computer-readable medium such as a magnetic tape or an optical or magnetic disk. The design control instructions typically encode data structures or other information describing the circuitry that can be physically created as the blocks of the integrated circuits. Although any appropriate format may be used for such encoding, such data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can then use such encoded data to fabricate integrated circuits comprising one or more of the circuits described herein.

In the foregoing description and in the accompanying drawings, specific terminology and drawing symbols are set forth to provide a thorough understanding of the present technology. In some instances, the terminology and symbols may imply specific details that are not required to practice the technology. For example, although the terms "first" and "second" have been used herein, unless otherwise specified, the language is not intended to provide any specified order but merely to assist in explaining elements of the technology.

Similarly, the specification and drawings have, for description purposes, provided labels to name certain signals or signals paths of the various embodiments of the technology. In some instances such a name may refer to a particular signal path and/or to the nature of the data or electrical characteristic of the associated signal path at a particular point of time and at a particular location. Generally, the context of these labels in the description will be indicative of the intended meaning of the labels as it relates to the particular feature being discussed.

Moreover, although the technology herein has been described with reference to particular embodiments, it is to be understood that these embodiments are merely illustrative of the principles and applications of the technology. It is therefore to be understood that numerous modifications may be made to the illustrative embodiments and that other arrangements may be devised without departing from the spirit and scope of the technology as illustrated in the following paragraphs. For example, the testing and measurement circuits need not be implemented in a memory controller or in the same chip as the memory controller. For example, the testing, measurement and/or related control circuits may be implemented as one or more add-on chips for a memory controller or memory such that the add-on chip can use the memory controller and the memory in any of the testing and adjusting processes. Moreover, the testing, measurement and/or related control chip may be separate from the memory controller such that it can be configured to test, measure and adjust a memory or other type of circuit chip that has multiple clock paths without using a memory controller type chip in the process.

By way of further example, although wired channels are explicitly mentioned, wireless channels may also be implemented with the technology such that wireless transmissions may be made between chips using wireless transmitters and receivers that operate by, for example, infrared data signals or electromagnetic data signals sent between the circuit blocks of the technology. Similarly, the channels may be implemented with capacitive, inductive and/or optical principles and components. Moreover, although a quadrature clocking system of the memory circuit has been expressly discussed, the principles may be applied with circuits having clocking schemes where fewer or greater numbers of clock paths or clock signals are implemented.

The invention claimed is:

1. A memory device, comprising:
   a clock generation circuit;
   a clock tree responsive to the clock generation circuit and operable to distribute at least two clock signals for use in parallel data operations of the memory device;
   a register to store a programmable value; and
   an adjustment circuit that receives one of the clock signals and generates therefrom a phase-adjusted clock signal in response to the programmable value using a variable delay element.

2. The memory device of claim 1, further comprising means for enabling selective programming of the programmable value by a memory controller.

3. The memory device of claim 1, where:
the register stores a programmable value for each generated clock signal;
the clock distribution circuit includes an adjustment circuit for each clock signal distributed by the clock tree, each adjustment circuit varying phase of a distributed version of the associated generated clock signal in response to a corresponding programmable value.

4. The memory device of claim 1, where the adjustment circuit adjusts relative phase between at least two clock signal fan outs in response to the programmable value.

5. The memory device of claim 1, where:
the clock tree is adapted to distribute at least N clock signals to use in parallel data operations of the memory device;
a register stores a programmable value for each of at least N−1 of the clock signals; and
the memory device further comprises an adjustment circuit corresponding to each programmable value, to vary phase for at least N−1 of the clock signals.

6. The memory device of claim 5, where a register stores a programmable value for each of at least N of the clock signals and where an adjustment circuit corresponding to each programmable value varies phase independently for each of the at least N clock signals.

7. The memory device of claim 5, where the each programmable value is a phase offset value, and where the device is adapted to vary relative phase between each pair of clock signals represented by the N clock signals.

8. The memory device of claim 1, further comprising an input-output interface at least partially clocked in response to the at least two clock signals.

9. The memory device of claim 1, where:
the memory device further comprises a voltage regulator to regulate a voltage supplied to the clock control circuit in response to the programmable value; and
the variable delay element imparts variable phase to the one of the clock signals in response to an output of the voltage regulator.

10. The memory device of claim 9, further comprising:
a voltage regulation circuit for each of the at least two clock, each voltage regulation circuit independently regulating power supply of a variable delay element for the associated clock signal to thereby provide individualized regulation of phase of the associated clock signal.

11. The memory device of claim 10, where the voltage regulation circuit includes a digitally controlled gain circuit and the variable delay element varies delay in response to an output of the gain circuit.

12. The memory device of claim 11, wherein the register is coupled to the digitally controlled gain circuit, with gain being controlled in response to contents of the register.

13. The memory device of claim 12, wherein each of the at least two clock signals includes a corresponding voltage regulation circuit, including a digitally controlled gain circuit and programmable offset value used to impart phase offset to the corresponding clock signal.

14. The memory device of claim 1, wherein the clock generation circuit comprises a phase-locked loop (PLL).

15. A method of operating a memory system, comprising:
generating a clock signal in a memory device;
distributing the clock signal in the form of a clock tree to operating circuits for use in parallel operations of the memory device, to provide plural, distributed clock signals;
programming a phase offset into a register in the memory device for at least one of the distributed clock signals; and
adjusting phase of at least one of the distributed clock signals relative to another of the distributed clock signals in response to the phase offset.

16. The method of claim 15, further comprising programming a phase offset into a register in the memory device for each of at least two of the clock signals, where adjusting relative phase includes independently adjusting phase for each of at least two clock signals.

17. The method according to claim 15, further comprising using a calibration mode to calculate phase offset.

18. The method according to claim 17, wherein the calibration mode is controller initiated, further comprising determining the phase offset at the controller and causing the controller to program the phase offset into the memory device.

19. The method according to claim 15, wherein adjusting phase includes controlling a variable voltage circuit to impart a phase delay.

20. A method according to claim 19, adapted for use with a memory system including at least one controller and plural memory devices, the method further comprising programming a phase offset into each of the plural memory devices.

21. A memory device, comprising:
a clock generation circuit;
a clock tree providing at least two distribution paths of a clock from the clock generation circuit for use in simultaneous data operations of the memory device;
a register to store a programmable value; and
a variable delay element in at least one of the clock distribution paths to generate a phase-adjusted clock signal in response to the programmable value, the variable delay element controlled responsive to the programmable value to adjust skew between at least two clock distribution paths.

22. The memory device of claim 21, further comprising at least four clock distribution paths, wherein each clock distribution path includes a respective variable delay element to impart programmable phase delay to adjust relative skew among the at least four clock distribution paths.

23. The memory device of claim 21, wherein the register is accessible to and programmable by a remote memory controller.

24. The memory device of claim 21, wherein the clock generation circuit comprises a phase-locked loop (PLL).

25. An integrated circuit, comprising:
a phase-locked loop circuit operable to receive an input clock signal and generate an output clock signal;
a clock tree to distribute the output clock signal for distribution to circuits that perform at least one of transmitting or sampling of data on a respective external signal path;
a plurality of phase adjusters, each receiving a respective clock from the clock tree, each phase adjuster operable to generate a timing signal used to time at least one of the circuits;
wherein
each phase adjuster includes a voltage regulation circuit and a corresponding voltage-controlled delay line,
each voltage regulation circuit is operable to control delay established by the corresponding voltage-controlled delay line, independent of other phase adjusters, and
each voltage-controlled delay line is operable to regulate phase of the respective timing signal.

26. The integrated circuit of claim 25, embodied as a memory device, the memory device comprising a memory core.

* * * * *